United States Patent
Bai et al.

(10) Patent No.: US 10,754,254 B1
(45) Date of Patent: Aug. 25, 2020

(54) EXTREME ULTRAVIOLET (EUV) EXPOSURE APPARATUS AND METHOD OF MANUFACTURING SEMICONDUCTOR DEVICE USING THE SAME

(71) Applicant: Samsung Electronics Co., Ltd., Suwon-si, Gyeonggi-do (KR)

(72) Inventors: Keunhee Bai, Suwon-si (KR); Jinhong Park, Yongin-si (KR); Jinseok Heo, Hwaseong-si (KR); Heeyoung Go, Yongin-si (KR); Seongchul Hong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/678,274

(22) Filed: Nov. 8, 2019

(30) Foreign Application Priority Data

May 2, 2019 (KR) ........................ 10-2019-0051619

(51) Int. Cl.
| | |
|---|---|
| *G03F 7/20* | (2006.01) |
| *G03F 1/82* | (2012.01) |
| *G03F 1/86* | (2012.01) |
| *H05G 2/00* | (2006.01) |

(52) U.S. Cl.
CPC ............ *G03F 7/70033* (2013.01); *G03F 1/82* (2013.01); *G03F 1/86* (2013.01); *G03F 7/707* (2013.01); *G03F 7/70691* (2013.01); *G03F 7/70733* (2013.01); *G03F 7/70825* (2013.01); *G03F 7/70908* (2013.01); *G03F 7/70925* (2013.01); *G03F 7/70941* (2013.01); *H05G 2/008* (2013.01)

(58) Field of Classification Search
CPC .. G03F 7/70908; G03F 7/708; G03F 7/70808; G03F 7/70858; G03F 7/70866; G03F 7/70916; G03F 7/70925; G03F 7/70941; G03F 7/70691; G03F 7/707; G03F 7/70733; G03F 7/70033; G03F 7/70041; G03F 7/7005; G03F 1/86; G03F 1/82
See application file for complete search history.

(56) References Cited

U.S. PATENT DOCUMENTS

| | | | |
|---|---|---|---|
| 5,401,356 A | 3/1995 | Enami et al. | |
| 6,707,528 B1 * | 3/2004 | Aoyama | G03B 27/42 355/18 |
| 6,972,420 B2 | 12/2005 | Silverman | |
| 8,163,652 B2 | 4/2012 | Maeda et al. | |

(Continued)

FOREIGN PATENT DOCUMENTS

| | | |
|---|---|---|
| JP | 3628939 | 3/2005 |
| JP | 2009185362 | 8/2009 |

(Continued)

*Primary Examiner* — Michelle M Iacoletti
(74) *Attorney, Agent, or Firm* — Myers Bigel, P.A.

(57) ABSTRACT

An extreme ultraviolet (EUV) exposure apparatus includes a chamber, an EUV source in the chamber and configured to generate an EUV beam, an optical system above the EUV source and configured to provide the EUV beam to a substrate, a substrate stage in the chamber and configured to receive the substrate, a reticle stage in the chamber and configured to hold a reticle that is configured to project the EUV beam onto the substrate, and a plasma source configured to provide plasma to the reticle to electrically neutralize the reticle charged by the EUV beam.

20 Claims, 11 Drawing Sheets

(56) References Cited

U.S. PATENT DOCUMENTS

| | | |
|---|---|---|
| 9,119,278 B2 | 8/2015 | Chrobak et al. |
| 9,280,050 B2 | 3/2016 | Sasaki |
| 9,412,566 B2 | 8/2016 | McNie et al. |
| 9,541,514 B2 | 1/2017 | Patrick |
| 2001/0055104 A1 | 12/2001 | Irie |
| 2002/0096647 A1* | 7/2002 | Moors ................ G03F 7/70558 250/492.1 |
| 2013/0255717 A1 | 10/2013 | Rose et al. |
| 2014/0253887 A1 | 9/2014 | Wu et al. |
| 2017/0060005 A1 | 3/2017 | Chang et al. |

FOREIGN PATENT DOCUMENTS

| | | |
|---|---|---|
| JP | 2012068579 | 4/2012 |
| JP | 2013093588 | 5/2013 |
| JP | 2013197465 | 9/2013 |
| JP | 2018077525 | 5/2018 |

* cited by examiner

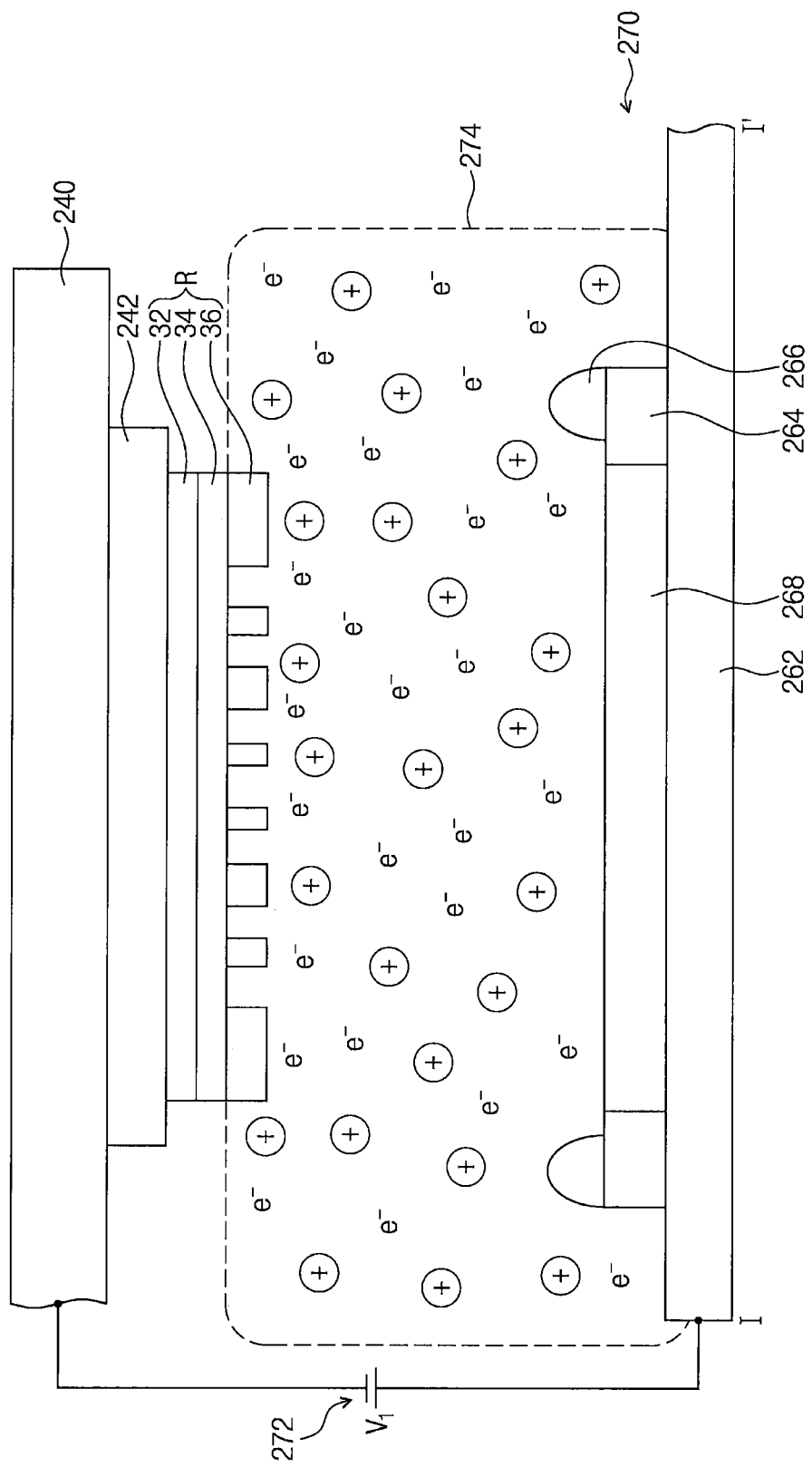

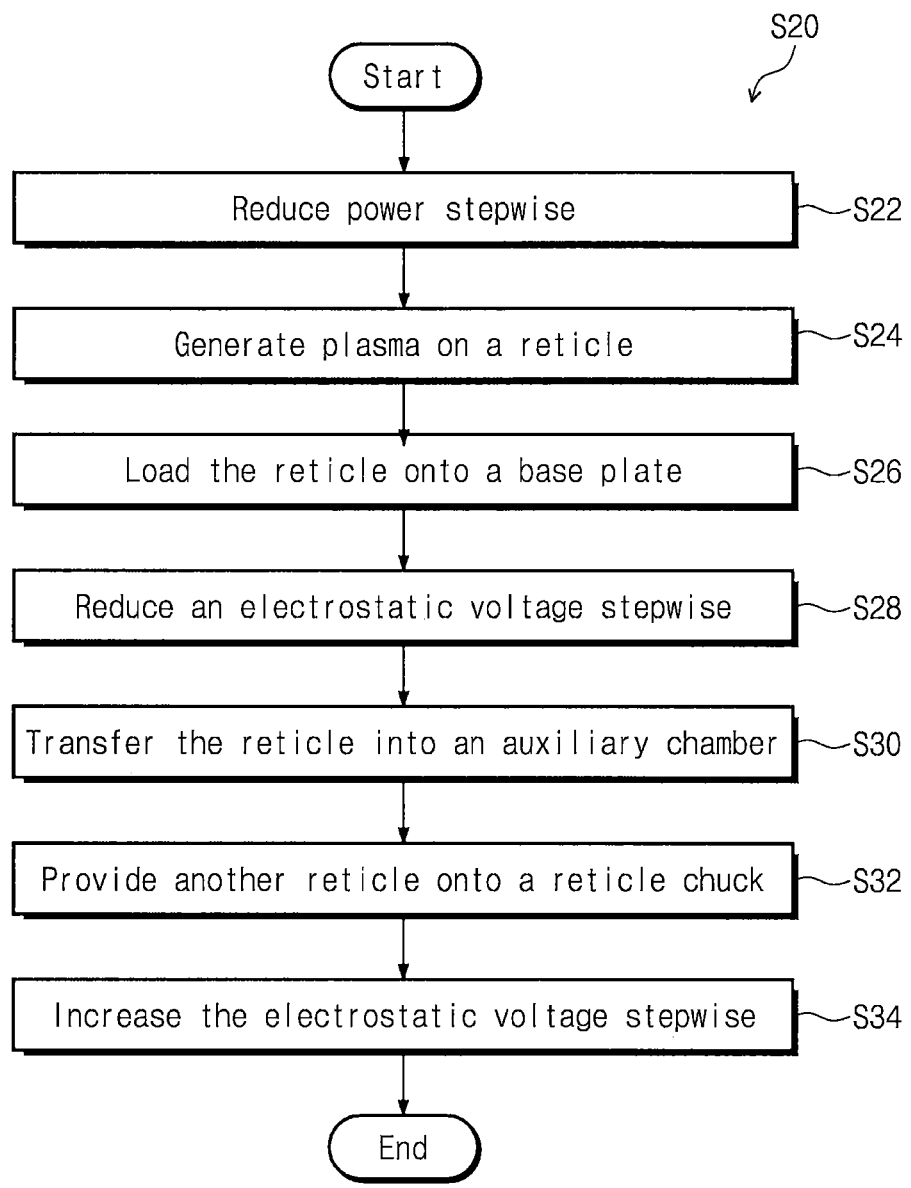

EXTREME ULTRAVIOLET (EUV) EXPOSURE APPARATUS AND METHOD OF MANUFACTURING SEMICONDUCTOR DEVICE USING THE SAME

CROSS-REFERENCE TO RELATED APPLICATION

This U.S. non-provisional patent application claims priority under 35 U.S.C. § 119 to Korean Patent Application No. 10-2019-0051619, filed on May 2, 2019 in the Korean Intellectual Property Office, the disclosure of which is hereby incorporated by reference herein in its entirety.

BACKGROUND

Embodiments of the inventive concepts relate to apparatus and methods of manufacturing a semiconductor device and, more particularly, to an extreme ultraviolet (EUV) exposure apparatus and a method of manufacturing a semiconductor device using the same.

Highly integrated semiconductor devices have been developed with the development of information technology. The integration density of semiconductor devices may be greatly affected by a wavelength of a light source of a photolithography process. The light source may be an I-line source, a G-line source, an excimer laser light source (e.g., KrF or ArF), or an extreme ultraviolet (EUV) light source of which a wavelength is shorter than that of the excimer laser light source. The energy of the EUV light source may be much greater than that of the excimer laser light source. The EUV light source may generate particle contamination of a reticle. The contaminated reticle may be replaced with a new one.

SUMMARY

Embodiments of the inventive concepts may provide an extreme ultraviolet (EUV) exposure apparatus capable of reducing or removing particle contamination, and a method of manufacturing a semiconductor device using the same.

In an aspect, an EUV exposure apparatus may include a chamber, an EUV source in the chamber and configured to generate an EUV beam, an optical system above the EUV source and configured to provide the EUV beam to a substrate, a substrate stage in the chamber and configured to receive the substrate, a reticle stage in the chamber and configured to hold a reticle that is configured to project the EUV beam onto the substrate, and a plasma source configured to provide plasma to the reticle to electrically neutralize the reticle charged by the EUV beam.

In an aspect, an EUV exposure apparatus may include a chamber, an EUV source in the chamber and configured to generate an EUV beam, an optical system above the EUV source and configured to provide the EUV beam to a substrate, a substrate stage in the chamber and configured to receive the substrate, a reticle stage in the chamber and configured to hold a reticle that is configured to project the EUV beam onto the substrate, a reticle chuck on the reticle stage and configured to hold the reticle, and a controller configured to control the reticle chuck and the EUV source. The controller may be configured to direct a stepwise increase or decrease of an electrostatic voltage provided to the reticle chuck.

In an aspect, a method of manufacturing a semiconductor device may include performing an exposure process on a substrate by using a reticle in an exposure apparatus, and exchanging the reticle. The exchanging of the reticle may include locally generating plasma on the reticle, and stepwise decreasing an electrostatic voltage provided to a reticle chuck of the exposure apparatus.

BRIEF DESCRIPTION OF THE DRAWINGS

The inventive concepts will become more apparent in view of the attached drawings and accompanying detailed description.

FIGS. 5A and 5B are cross-sectional views taken along a line I-I' of FIG. 4.

FIG. 12 is a flowchart illustrating an embodiment of a step of exchanging a reticle of FIG. 10.

DETAILED DESCRIPTION OF THE EMBODIMENTS

Figure 1:
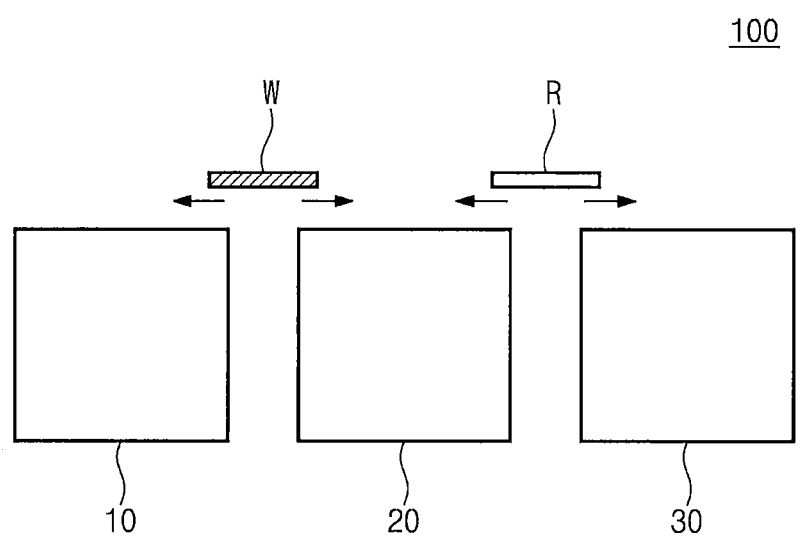
FIG. 1 is a schematic view illustrating a system for manufacturing a semiconductor device, according to some embodiments of the inventive concepts.

FIG. 1 illustrates a system 100 for manufacturing a semiconductor device, according to some embodiments of the inventive concepts.

Referring to FIG. 1, a system 100 for manufacturing a semiconductor device according to some embodiments may be a photolithography system. The manufacturing system 100 may form a photoresist pattern on a substrate W. In some embodiments, the manufacturing system 100 may include a spinner apparatus 10, an exposure apparatus 20, and a reticle storage apparatus 30. The spinner apparatus 10 and the exposure apparatus 20 may form a photoresist pattern on the substrate W. The substrate W may be transferred between the spinner apparatus 10 and the exposure apparatus 20. The spinner apparatus 10 may perform a coating process of a photoresist, and a development process. The exposure apparatus 20 may perform an exposure process of the photoresist. For example, the exposure apparatus 20 may be an extreme ultraviolet (EUV) exposure apparatus. The reticle storage apparatus 30 may store a reticle R temporarily and/or for a long period of time. The reticle R may be transferred between the exposure apparatus 20 and the reticle storage apparatus 30 in an exchanging process thereof. A size of the reticle R may be equal to or greater than a size of the substrate W. The reticle R may be moved between the exposure apparatus 20 and the reticle storage apparatus 30 while being loaded in a reticle pod. However, embodiments of the inventive concepts are not limited thereto.

Figure 2:
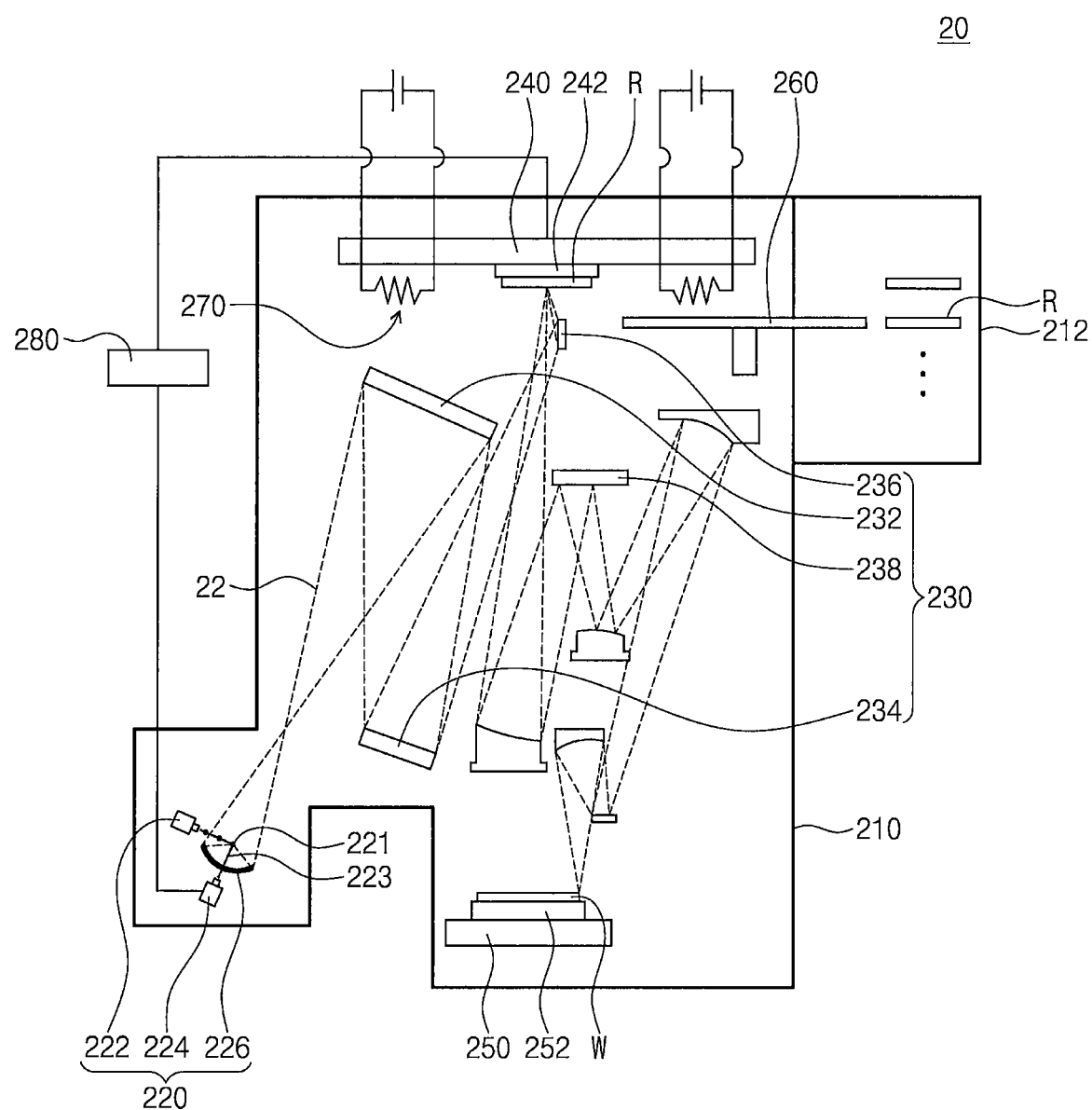
FIG. 2 is a cross-sectional view illustrating an embodiment of an exposure apparatus of FIG. 1.

FIG. 2 illustrates an embodiment of the exposure apparatus 20 of FIG. 1.

Referring to FIG. 2, the exposure apparatus 20 may include a chamber 210, an EUV source 220, an optical system 230, a reticle stage 240, a substrate stage 250, a rapid exchange device 260, a plasma source 270, and a controller 280.

The chamber 210 may define or provide an inner space into which the substrate W and the reticle R are loaded. The inner space of the chamber 210 may be independent of the outside when a process is performed. For example, the inner space of the chamber 210 may be in a vacuum state and/or sealed from the outside when a process is performed.

The EUV source 220 may be disposed at one side in the chamber 210.

The EUV source 220 may generate an EUV beam 22. The EUV beam 22 may be a plasma beam. In some embodiments, the EUV source 220 may include a source drop generator 222, a laser 224, and a collector mirror 226. The source drop generator 222 may generate a source drop 221. The source drop 221 may be or include a metal liquid drop of tin (Sn), xenon (Xe), titanium (Ti) or lithium (Li). The laser 224 may provide a laser beam 223 to the source drop 221 to generate the BUY beam 22. The laser beam 223 may be a pump light of the EUV beam 22. An intensity of the EUV beam 22 may be in proportion to an intensity or power of the laser beam 223. The collector mirror 226 may focus or concentrate the EUV beam 22 to the optical system 230. For example, the collector mirror 226 may be or include a concave mirror.

The optical system 230 may be disposed between the reticle stage 240 and the substrate stage 250. The optical system 230 may sequentially provide the EUV beam 22 to the reticle R and the substrate W. For example, the optical system 230 may include a field facet mirror 232, a pupil facet mirror 234, a grazing mirror 236, and projection mirrors 238. The field facet mirror 232, the pupil facet mirror 234 and the grazing mirror 236 may be used as an illumination system for providing the EUV beam 22 to the reticle R. The field facet mirror 232 may reflect the EUV beam 22 to the pupil facet mirror 234. The pupil facet mirror 234 may reflect the EUV beam 22 toward the reticle R. The field facet mirror 232 and the pupil facet mirror 234 may collimate the EUV beam 22. The grazing mirror 236 may be disposed between the pupil facet mirror 234 and the reticle R. The grazing mirror 236 may adjust a grazing incident angle of the EUV beam 22. The projection mirrors 238 may be used as a projection objective (or objective lens) for providing the EUV beam 22 to the substrate W. The projection mirrors 238 may provide the EUV beam 22 to the substrate W.

The reticle stage 240 may be disposed in an upper region of the inner space of the chamber 210. The reticle stage 240 may have a reticle chuck 242 (or the reticle chuck 242 may be on the reticle stage 240). The reticle chuck 242 may electrostatically hold the reticle R by using an electrostatic voltage 244 of FIG. 8. For example, the reticle R may be a reflective mask. The reticle R may reflect a portion of the EUV beam 22 to the projection mirrors 238 and may absorb another portion of the EUV beam 22. The projection mirrors 238 may reflect the reflected portion of the EUV beam 22 to the substrate W.

The substrate stage 250 may be disposed in a lower region of the inner space of the chamber 210. The substrate stage 250 may have a substrate chuck 252 (or the substrate chuck 252 may be on the substrate stage 250). The substrate chuck 252 may receive the substrate W. The substrate chuck 252 may electrostatically hold the substrate W. The substrate W may be exposed to the EUV beam 22. A photoresist on the substrate W may be partially exposed to the EUV beam 22 along a pattern of the reticle R.

An auxiliary chamber 212 may be provided at a side of the chamber 210. When the reticle R is exchanged, the auxiliary chamber 212 may temporarily store the reticle R. The reticle R in the auxiliary chamber 212 may be transferred into the reticle storage apparatus 30 of FIG. 1 by a transfer device (e.g., an overhead hoisting transfer (OHT) device).

The rapid exchange device 260 may be disposed between the reticle stage 240 and the auxiliary chamber 212. The rapid exchange device 260 may exchange the reticle R on the reticle chuck 242. The rapid exchange device 260 may transfer the reticle R between the reticle chuck 242 and the auxiliary chamber 212.

The plasma sources 270 may be disposed adjacent to the reticle R. The plasma sources 270 may be disposed at or on both sides of the reticle chuck 242, respectively. The plasma sources 270 may be disposed between the reticle stage 240 and the optical system 230.

Figure 3:
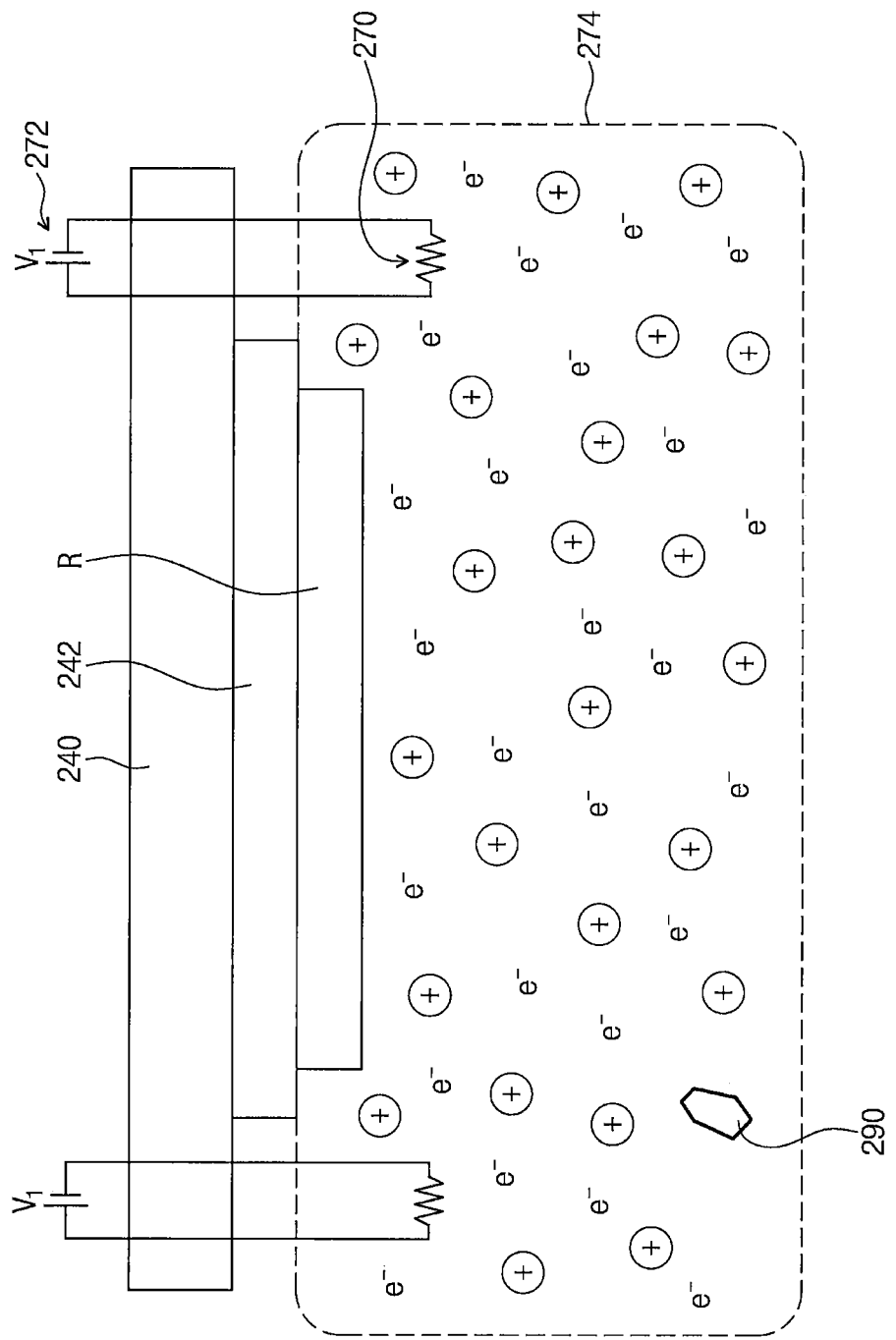
FIG. 3 is a view illustrating an embodiment of a plasma source of FIG. 2.

FIG. 3 illustrates an embodiment of the plasma sources 270 of FIG. 2.

Referring to FIG. 3, the plasma sources 270 may generate plasma 274 to electrically neutralize the reticle R. For example, the plasma sources 270 may be or include filament electrodes.

The reticle R may be charged with negative charges or positive charges by the electrostatic voltage 244 (see FIG. 8) of the reticle chuck 242 or the EUV beam 22. The plasma sources 270 may be used as plasma electrodes to generate the plasma 274 on the reticle R. The plasma 274 may electrically treat the reticle R to neutralize the reticle R. When the EUV beam 22 is not provided to the reticle R, the plasma 274 may be locally generated on the reticle R. When power sources 272 provide a first voltage $V_1$ to the plasma sources 270, the plasma sources 270 may generate the plasma 274 by using the first voltage $V_1$. The first voltage $V_1$ may be a DC voltage or radio-frequency power of an alternating current (AC). In certain embodiments, the plasma 274 may clean the reticle R by a dry method. Thus, the plasma source 270 may reduce or remove a contaminant (e.g., particles 290) on the reticle R by using the plasma 274.

Referring again to FIG. 2, the controller 280 may be connected or operatively connected to the laser 224 and the reticle chuck 242. In addition, the controller 280 may also be connected or operatively connected to the substrate chuck 252. The controller 280 may provide power to or otherwise control the laser 224 to increase or reduce the intensity of the EUV beam 22. The controller 280 may control or provide the electrostatic voltage to the reticle chuck 242 and the substrate chuck 252 to hold the reticle R and the substrate W on the reticle chuck 242 and the substrate chuck 252, respectively. In addition, the controller 280 may control the reticle chuck 242 and the substrate chuck 252 to expose the substrate W to the EUV beam 22. For example, the photoresist on the substrate W may be progressively scanned by the EUV beam 22 through movement of the reticle chuck 242 and the substrate chuck 252.

Figure 4:
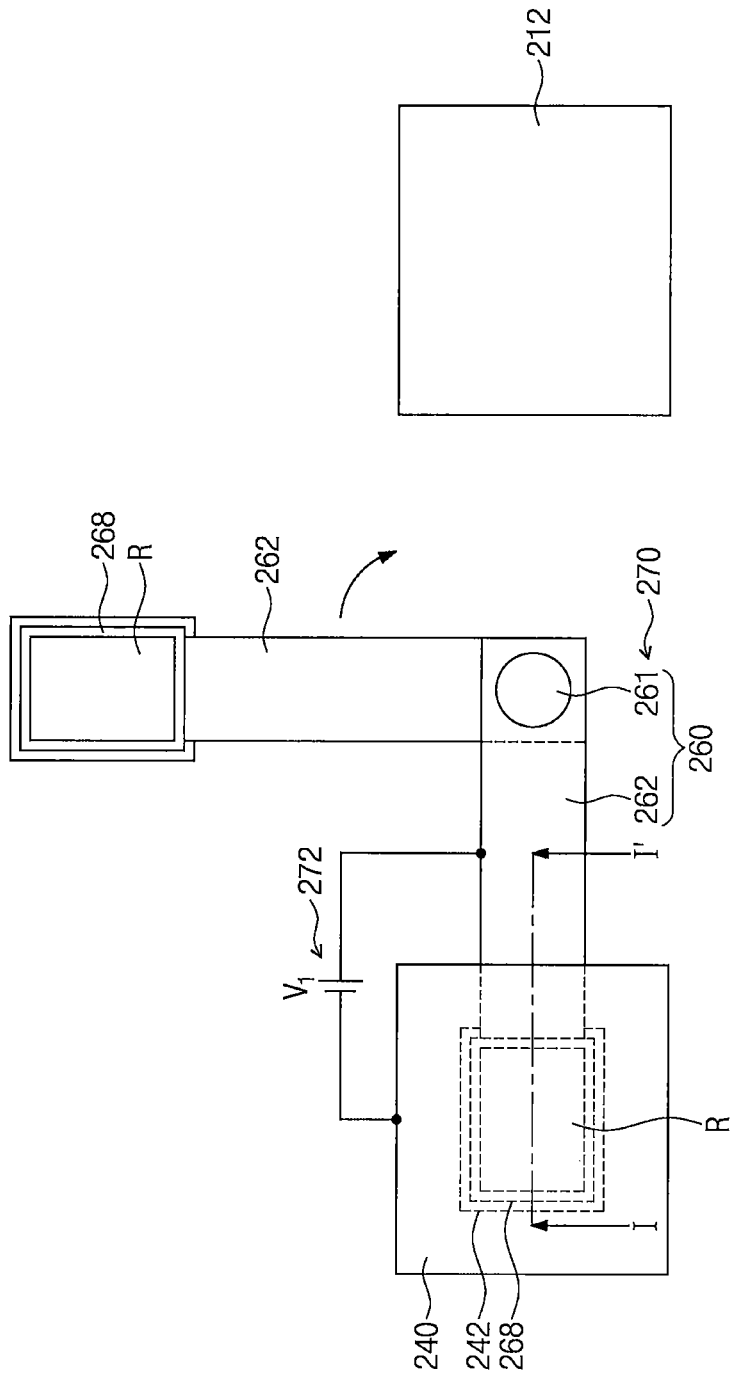
FIG. 4 is a plan view illustrating an embodiment of a rapid exchange device of FIG. 2.
Figure 5A:
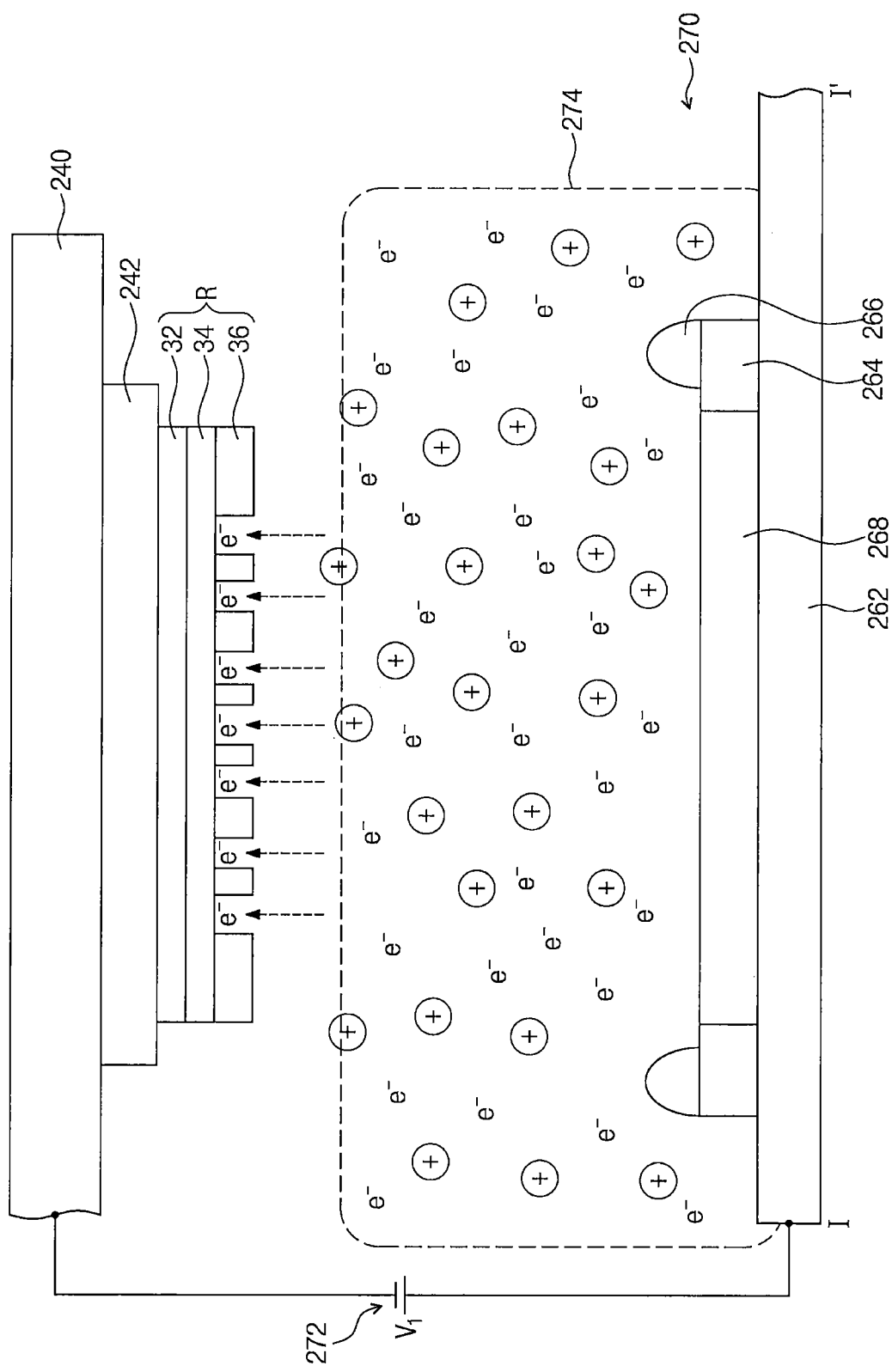

FIG. 4 illustrates an embodiment of the rapid exchange device 260 of FIG. 2. FIGS. 5A and 5B are cross-sectional views taken along a line I-I' of FIG. 4.

Referring to FIGS. 4, 5A and 5B, the rapid exchange device 260 may be used as the plasma source 270. The power source 272 may be connected to the reticle stage 240 and the rapid exchange device 260 and may provide the first voltage $V_1$ between the reticle stage 240 and the rapid exchange device 260. The rapid exchange device 260 may generate the plasma 274 on the reticle R by using the first voltage $V_1$. The plasma 274 may neutralize the reticle R.

Alternatively, the reticle stage 240 may be used as the plasma source 270. For example, the reticle stage 240 may generate the plasma 274 on the reticle R by using the first voltage $V_1$. The plasma 274 may clean the reticle R. The first voltage $V_1$ may be controlled by a control signal of the controller 280 (FIG. 2). A contaminant (e.g., particles 290 in FIG. 3) on the reticle R may be reduced or removed by the plasma 274.

Referring to FIG. 4, the rapid exchange device 260 may include a shaft 261 and robot arms 262. The shaft 261 may be disposed between the auxiliary chamber 212 and the reticle stage 240. The robot arms 262 may be connected to the shaft 261. The robot arms 262 may rotate using the shaft 261 as a central axis. The robot arms 262 and the shaft 261 may transfer the reticle R between the reticle stage 240 and the auxiliary chamber 212.

Referring to FIGS. 5A and 5B, each of the robot arms 262 may have sleeves 264, supporters 266, and a base plate 268. The sleeves 264 may be disposed on the robot arm 262. The supporters 266 may be disposed on the sleeves 264. The supporters 266 may be provided on an edge of the reticle stage 240 around the reticle R when the reticle R is exchanged. The base plate 268 may be disposed between the sleeves 264. The base plate 268 may receive the reticle R.

In some embodiments, the reticle R may include a reticle substrate 32, a reflective layer 34, and an absorption pattern or absorption patterns 36. The reticle substrate 32 may be or include a glass plate or a metal plate. The reflective layer 34 may be disposed on the reticle substrate 32. The reflective layer 34 may reflect the EUV beam 22. For example, the reflective layer 34 may have a multi-layered stack structure of a silicon layer and a molybdenum layer. The absorption patterns 36 may be disposed on the reflective layer 34. The absorption patterns 36 may absorb the EUV beam 22. The EUV beam 22 may be reflected by the reflective layer 34 exposed by the absorption patterns 36, and thus the reflected EUV beam 22 may have an image of the absorption patterns 36. The EUV beam 22 may project the image of the absorption patterns 36 onto the photoresist of the substrate W.

Referring to FIG. 5A, when the reticle R is charged, electrons (e) may be mainly provided between the absorption patterns 36. The electrons (e) between the absorption patterns 36 may charge the reticle R with negative charges. Positive ions (+) in the plasma 274 may be concentrated close to the reticle R.

Referring to FIG. 5B, when the absorption patterns 36 are provided in the plasma 274, the plasma 274 may remove the electrons (e) between or from the absorption patterns 36 to neutralize the reticle R. The plasma 274 may neutralize the reticle R without arc defects. The plasma 274 may also remove particles 290 (FIG. 3) on the reticle R.

Figure 6:
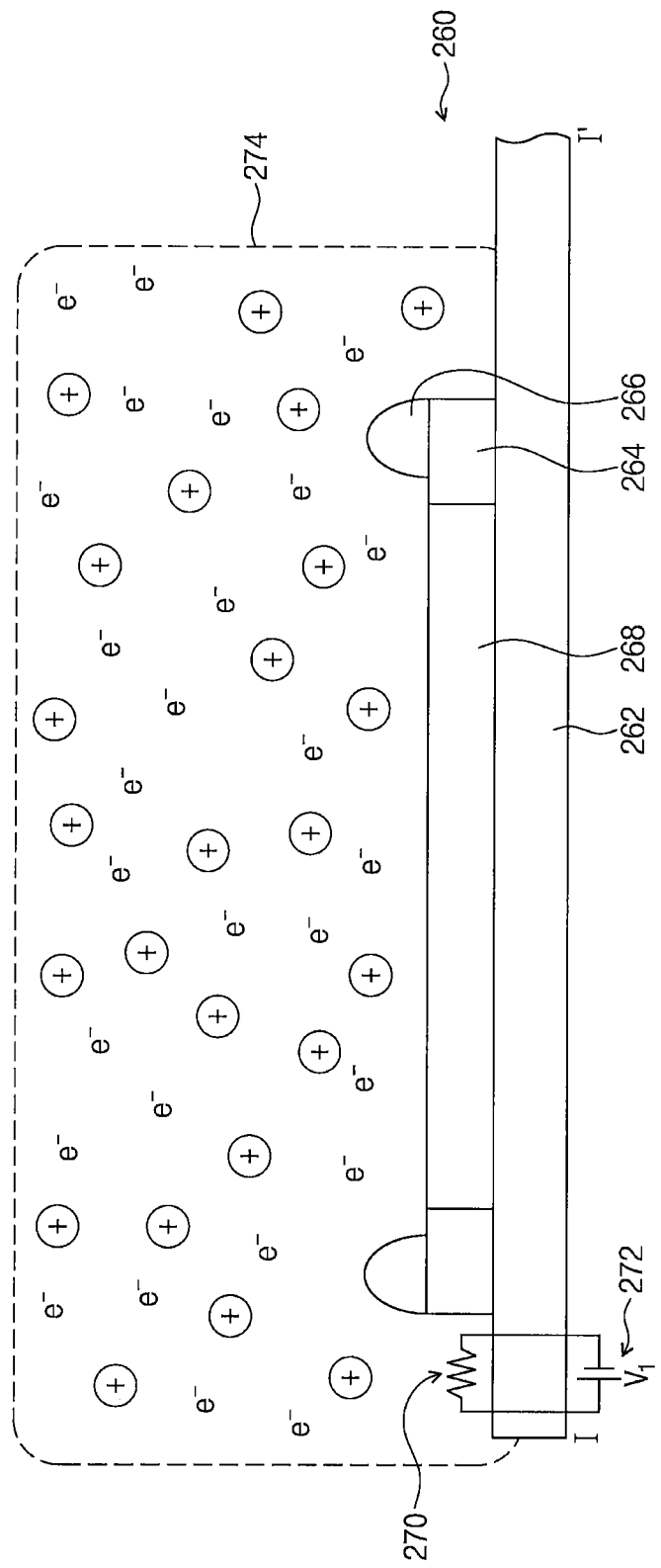
FIG. 6 is a view illustrating an embodiment of a plasma source of FIG. 2.

FIG. 6 illustrates an embodiment of the plasma source 270 of FIG. 2.

Referring to FIG. 6, a plasma source 270 may be disposed at an end or a tip of the robot arm 262 of the rapid exchange device 260. The plasma source 270 may be disposed outside or spaced apart from the sleeves 264, the supporters 266 and the base plate 268 (e.g., the plasma source 270 may be between a terminal end of the robot arm 262 and the sleeves 264, the supporters 266 and the base plate 268). The power source 272 may provide the first voltage $V_1$ to the plasma source 270. The plasma source 270 may generate the plasma 274 on the sleeves 264, the supporters 266 and the base plate 268 by using the first voltage $V_1$.

Figure 7:
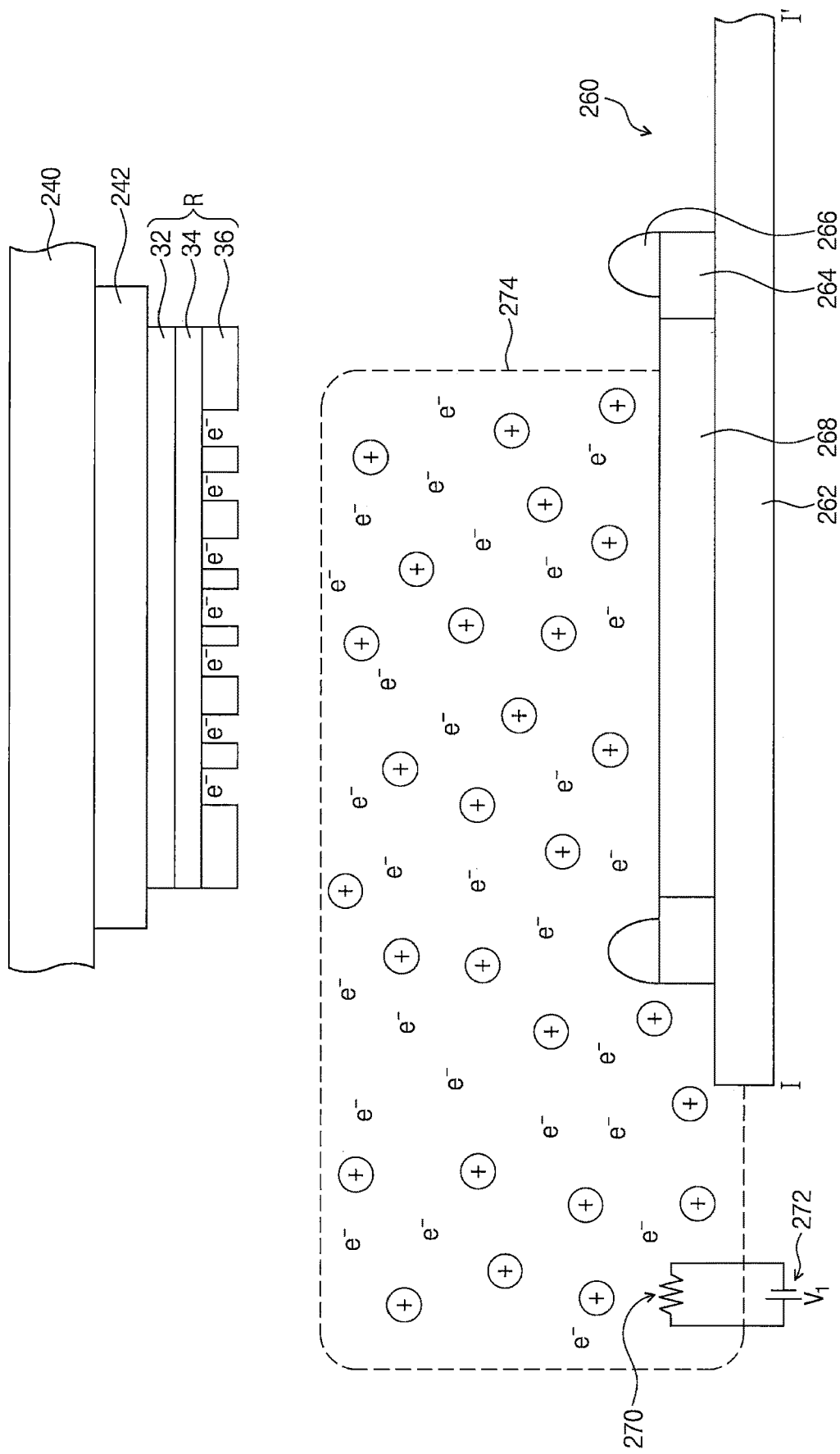
FIG. 7 is a view illustrating an embodiment of a plasma source of FIG. 2.

FIG. 7 illustrates an embodiment of the plasma source 270 of FIG. 2.

Referring to FIG. 7, a plasma source 270 may be separated from or spaced apart from the rapid exchange device 260 and the reticle stage 240 and may be disposed independently thereof. The plasma source 270 may be disposed adjacent to the robot arm 262 of the rapid exchange device 260 (e.g., adjacent an end of the robot arm 262) and thus may induce the plasma 274 on the sleeves 264, the supporters 266 and the base plate 268. The plasma 274 may neutralize the reticle R and may reduce or remove particles 290 (FIG. 3).

Figure 8:
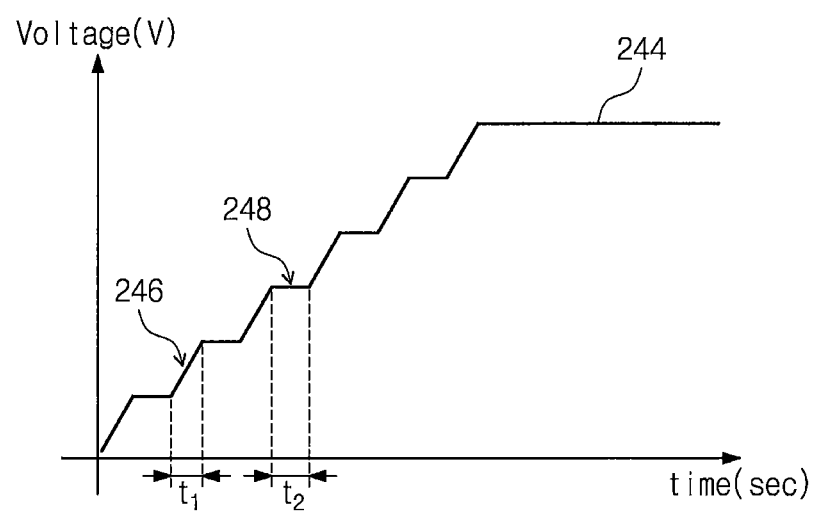
FIG. 8 is a graph illustrating an embodiment of an electrostatic voltage provided to a reticle chuck of FIG. 2.

FIG. 8 illustrates an embodiment of the electrostatic voltage 244 provided to a reticle chuck of FIG. 2.

Referring to FIG. 8, the controller 280 may control or provide the electrostatic voltage 244 to the reticle chuck 242. The electrostatic voltage 244 may increase stepwise. The stepwise electrostatic voltage 244 may have an instant rising or increasing segment 246 and an instant saturation or constant segment 248. The instant rising segment 246 and the instant saturation segment 248 may be repeated until the electrostatic voltage 244 reaches the maximum value of, for example, 20V to 200V. The instant rising segment 246 may be a segment in which the electrostatic voltage 244 increases or rises. The electrostatic voltage 244 may increase or rise by a voltage of about 5V to about 10V during the instant rising segment 246. For example, the instant rising segment 246 may have a first time duration $t_1$ of about 0.1 second to about 1 second. The instant saturation segment 248 may be a segment in which the increase or rise of the electrostatic voltage 244 is stopped and the electrostatic voltage 244 is constant. A time duration of the instant saturation segment 248 may be equal to or longer than that of the instant rising segment 246. For example, the instant saturation segment 248 may have a second time duration $t_2$ of about 0.1 second to about 1 second.

When the EUV beam 22 is provided to the reticle R, induced plasma and sheath may be formed on a top surface of the reticle R. The sheath may be generated between the top surface of the reticle R and the induced plasma. For example, the sheath may have a negative voltage. Typically, a rapidly rising electrostatic voltage may remove the sheath to cause a contaminant (e.g., the particles 290 in FIG. 3) on the reticle R. On the contrary, the stepwise electrostatic voltage 244 may stabilize the induced plasma during the second time duration $t_2$ to prevent the sheath from being removed. As a result, the stepwise electrostatic voltage 244 may protect the sheath to reduce or remove the contaminant (e.g., the particles 290 in FIG. 3). In certain embodiments, the electrostatic voltage 244 may be reduced stepwise.

Figure 9:
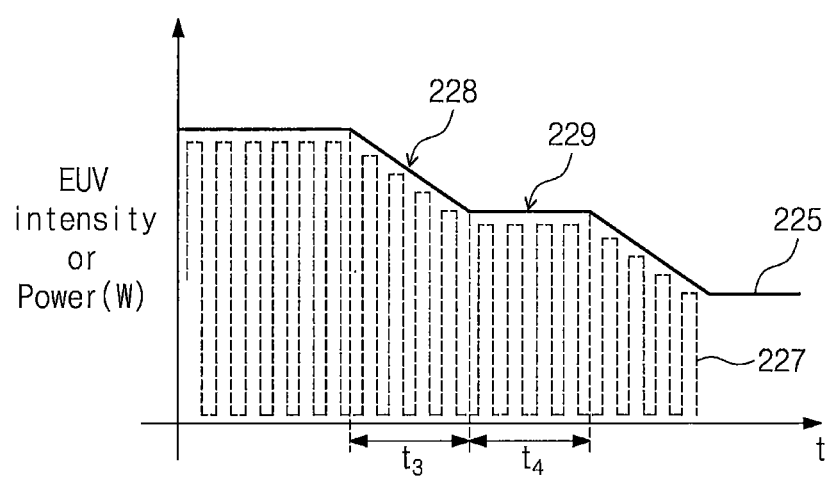
FIG. 9 is a graph showing power provided to a laser of FIG. 2 and a pulse intensity of an extreme ultraviolet (EUV) beam of FIG. 2.

FIG. 9 shows power 225 provided to the laser 224 of FIG. 2 and a pulse intensity 227 of the EUV beam 22 of FIG. 2.

Referring to FIGS. 2 and 9, the controller 280 may control or provide stepwise power 225 to the laser 224. The stepwise power 225 may generate the laser beam 223 of the laser 224 to output the EUV beam 22 having a stepwise pulse intensity 227. The stepwise pulse intensity 227 of the EUV beam 22 may decrease or increase depending on the power 225. For example, each of the power 225 and the pulse intensity 227 may have a descending or decreasing segment 228 and a saturation or constant segment 229. The descending segment 228 and the saturation segment 229 may be repeated. For example, the descending segment 228 may have a third time duration $t_3$ of about 1 second to about 10 seconds. The saturation segment 229 may have a fourth time duration $t_4$ equal to the third time duration $t_3$. The power 225 and the pulse intensity 227 may stabilize the induced plasma during the fourth time duration $t_4$ to prevent removal of the sheath. As a result, the stepwise power 225 and the stepwise pulse intensity 227 may protect the induced plasma and the sheath to reduce or remove the contaminant (e.g., the particles 290 in FIG. 3).

A method of manufacturing a semiconductor device using the manufacturing system 100 described above will be described hereinafter.

Figure 10:
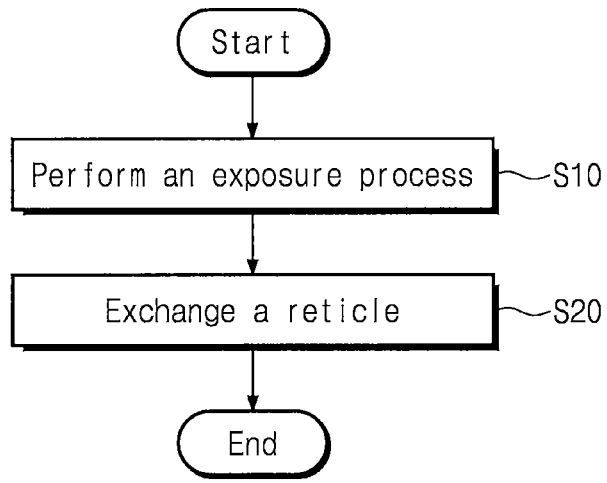
FIG. 10 is a flowchart illustrating a method of manufacturing a semiconductor device, according to some embodiments of the inventive concepts.

FIG. 10 illustrates a method of manufacturing a semiconductor device, according to some embodiments of the inventive concepts.

Referring to FIG. 10, a method of manufacturing a semiconductor device according to some embodiments of the inventive concepts may include performing an exposure process (S10) and exchanging a reticle R (S20).

When a coating process of a photoresist is completed by the spinner apparatus 10, the exposure apparatus 20 may perform the exposure process on the photoresist of a substrate W (S10).

Figure 11:
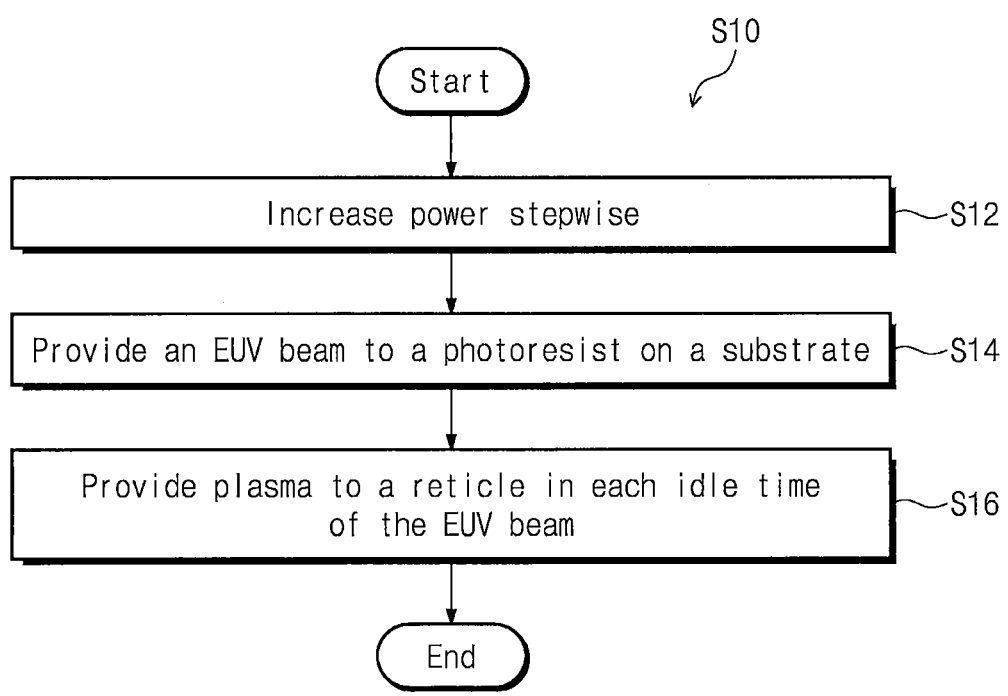
FIG. 11 is a flowchart illustrating an embodiment of a step of performing an exposure process of FIG. 10.

FIG. 11 illustrates an embodiment of the step S10 of performing the exposure process of FIG. 10.

Referring to FIG. 11, the performing of the exposure process (S10) may include increasing power 225 stepwise (S12), providing an EUV beam 22 to the photoresist on the substrate W (S14), and providing plasma 274 to the reticle R in each idle time of the EUV beam 22 (S16).

The controller 280 may increase the power 225 stepwise to generate a laser beam 223 (S12). The laser beam 223 may increase the pulse intensity 227 of the EUV beam 22 stepwise.

When the pulse intensity 227 and the electrostatic voltage 244 reach their maximum values, the controller 280 may move the substrate W and the reticle R to provide the EUV beam 22 to the photoresist on the substrate W (S14). The photoresist may be exposed to the EUV beam 22 along shapes of the absorption patterns 36 of the reticle R. Thereafter, the spinner apparatus 10 may develop the exposed photoresist to form a photoresist pattern.

The plasma source 270 may provide the plasma 274 to the reticle R in each idle time of the EUV beam 22 (S16). The plasma 274 may electrically neutralize the reticle R. In certain embodiments, the plasma 274 may clean the reticle R by a dry method. A contaminant (e.g., particles 290) of the reticle R may be reduced or removed.

Referring again to FIG. 10, when a preventive maintenance of the exposure apparatus 20 or the reticle R is performed, the rapid exchange device 260 may exchange the reticle R (S20). The reticle R may be exchanged at regular intervals. In addition, the reticle R may be exchanged when a process of the substrate W is changed.

FIG. 12 illustrates an embodiment of the step S20 of exchanging the reticle R of FIG. 10.

Referring to FIG. 12, the exchanging of the reticle R (S20) may include reducing the power 225 stepwise (S22), generating plasma 274 on the reticle R (S24), loading the reticle R onto the base plate 268 (S26), reducing the electrostatic voltage 244 stepwise (S28), transferring the reticle R into the auxiliary chamber 212 (S30), providing another reticle R onto the reticle chuck 242 (S32), and increasing the electrostatic voltage 244 stepwise (S34).

The controller 280 may reduce the power 225 of the laser 224 stepwise to remove or reduce the EUV beam 22 (S22).

The plasma source 270 may generate the plasma 274 on the reticle R (S24). The plasma 274 may neutralize the reticle R to reduce or remove a contaminant (e.g., particles 290). The plasma 274 may reduce or remove arc defects between the reticle R and the rapid exchange device 260.

Next, the rapid exchange device 260 may move the robot arm 262 under the reticle R to load the reticle R onto the base plate 268 (S26).

The controller 280 may reduce the electrostatic voltage 244 stepwise to separate the reticle R from the reticle chuck 242 (S28).

The rapid exchange device 260 may transfer the reticle R into the auxiliary chamber 212 (S30). The reticle R may be temporarily stored in the auxiliary chamber 212. The plasma 274 may be continuously provided in the processes of separating and transferring the reticle R.

The rapid exchange device 260 may provide another reticle R onto the reticle chuck 242 (S32). The other reticle R may be aligned on the reticle chuck 242.

The controller 280 may increase the electrostatic voltage 244 stepwise to hold the other reticle R on the reticle chuck 242 (S34). The other reticle R may be held or fixed on the reticle chuck 242 without contamination of particles 290.

According to the embodiments of the inventive concepts, the EUV exposure apparatus may reduce or remove the particle contamination of the reticle by using the plasma source to locally generate the plasma on the reticle.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. An extreme ultraviolet (EUV) exposure apparatus comprising:
   a chamber;
   an EUV source in the chamber and configured to generate an EUV beam;
   an optical system above the EUV source and configured to provide the EUV beam to a substrate;
   a substrate stage in the chamber and configured to receive the substrate;
   a reticle stage in the chamber and configured to hold a reticle that is configured to project the EUV beam onto the substrate;
   a plasma source configured to provide plasma to the reticle to electrically neutralize the reticle charged by the EUV beam; and
   a controller configured to control the EUV source,
   wherein the controller is configured to provide stepwise power to the EUV source.

2. The EUV exposure apparatus of claim 1, wherein the plasma source is on the reticle stage adjacent the reticle.

3. The EUV exposure apparatus of claim 2, further comprising:
   a reticle chuck on the reticle stage,
   wherein the plasma source is spaced apart from the reticle chuck.

4. The EUV exposure apparatus of claim 3, wherein the controller is configured to control the reticle chuck and is configured to provide a stepwise electrostatic voltage to the reticle chuck.

5. The EUV exposure apparatus of claim 1, further comprising:

an auxiliary chamber at a side of the chamber and configured to store the reticle; and an exchange device configured to move the reticle between the reticle stage and the auxiliary chamber.

6. The EUV exposure apparatus of claim 5, wherein the exchange device comprises the plasma source.

7. The EUV exposure apparatus of claim 5, wherein the exchange device comprises:

a shaft; and a robot arm connected to the shaft, wherein the robot arm has a base plate configured to receive the reticle.

8. The EUV exposure apparatus of claim 7, wherein the plasma source is on an end of the robot arm and spaced apart from the base plate.

9. The EUV exposure apparatus of claim 7, wherein the plasma source is adjacent the robot arm and the reticle stage.

10. An extreme ultraviolet (EUV) exposure apparatus comprising:

a chamber;

an EUV source in the chamber and configured to generate an EUV beam;

an optical system above the EUV source and configured to provide the EUV beam to a substrate;

a substrate stage in the chamber and configured to receive the substrate;

a reticle stage in the chamber and configured to hold a reticle that is configured to project the EUV beam onto the substrate;

a reticle chuck on the reticle stage and configured to hold the reticle; and a controller configured to control the reticle chuck and the EUV source, wherein the controller is configured to direct a stepwise increase or decrease of an electrostatic voltage provided to the reticle chuck.

11. The EUV exposure apparatus of claim 10, wherein the EUV source comprises:

a source drop generator configured to generate a source drop; and a laser configured to provide a laser beam to the source drop to generate the EUV beam, wherein the controller is configured to direct a stepwise increase or decrease of power provided to the laser.

12. The EUV exposure apparatus of claim 10, further comprising:

a plasma source in the chamber and configured to provide plasma to the reticle.

13. The EUV exposure apparatus of claim 12, wherein the plasma source is adjacent the reticle stage.

14. The EUV exposure apparatus of claim 12, further comprising:

an exchange device configured to exchange the reticle on the reticle stage with another reticle, wherein the exchange device comprises:

a shaft; and a robot arm connected to the shaft, wherein the plasma source is at a tip of the robot arm.

15. The EUV exposure apparatus of claim 12, further comprising:

an exchange device configured to exchange the reticle on the reticle stage with another reticle, wherein the exchange device comprises the plasma source.

16. A method of manufacturing a semiconductor device, the method comprising:

performing an exposure process on a substrate by using a reticle in an exposure apparatus; and exchanging the reticle, wherein the exchanging of the reticle comprises:

locally generating plasma on the reticle; and stepwise decreasing an electrostatic voltage provided to a reticle chuck of the exposure apparatus.

17. The method of claim 16, wherein the performing of the exposure process comprises:

generating an extreme ultraviolet (EUV) beam by stepwise increasing power provided to a laser of the exposure apparatus; and providing the EUV beam to the substrate.

18. The method of claim 17, wherein the performing of the exposure process further comprises: providing the plasma onto the reticle in each idle time of the EUV beam.

19. The method of claim 17, wherein the exchanging of the reticle further comprises:

stepwise decreasing the power provided to the laser.

20. The method of claim 16, wherein the exchanging of the reticle further comprises:

loading the reticle on a base plate;

transferring the reticle into an auxiliary chamber;

providing another reticle onto the reticle chuck; and increasing the electrostatic voltage stepwise.

\* \* \* \* \*